United States Patent
Lee et al.

(10) Patent No.: US 9,801,278 B2
(45) Date of Patent: Oct. 24, 2017

(54) CURVED DISPLAY DEVICE AND METHOD FOR MANUFACTURING THE SAME

(71) Applicant: Samsung Display Co., Ltd., Yongin (KR)

(72) Inventors: Jae Sok Lee, Asan-si (KR); Seung Chang Woo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 14/686,743

(22) Filed: Apr. 14, 2015

(65) Prior Publication Data
US 2016/0165726 A1    Jun. 9, 2016

(30) Foreign Application Priority Data

Dec. 8, 2014  (KR) .......................... 10-2014-0174887

(51) Int. Cl.
| H05K 1/00 | (2006.01) |
| H05K 1/14 | (2006.01) |
| H05K 1/02 | (2006.01) |
| H05K 1/18 | (2006.01) |

(52) U.S. Cl.
CPC ........... *H05K 1/147* (2013.01); *H05K 1/0292* (2013.01); *H05K 1/189* (2013.01); *H05K 2201/0909* (2013.01); *H05K 2201/10128* (2013.01)

(58) Field of Classification Search
CPC ...... H05K 1/0292; H05K 1/147; H05K 1/189; H05K 2201/0909; H05K 2201/10128
See application file for complete search history.

(56) References Cited

U.S. PATENT DOCUMENTS

| 6,583,844 B1* | 6/2003 | Mishima ............. G02F 1/13452 349/149 |
| 7,746,439 B2* | 6/2010 | Kohno ................ G02F 1/13452 349/150 |
| 2008/0186415 A1 | 8/2008 | Boud et al. |
| 2014/0320779 A1* | 10/2014 | Noumi ................ G02F 1/13452 349/58 |
| 2015/0316810 A1* | 11/2015 | Shibahara ............ G02F 1/1333 349/150 |

FOREIGN PATENT DOCUMENTS

| KR | 10-1999-0057461 | 7/1999 |
| KR | 10-0649705 | 11/2006 |
| KR | 10-1250799 | 4/2013 |

* cited by examiner

*Primary Examiner* — Yuriy Semenenko
(74) *Attorney, Agent, or Firm* — H.C. Park & Associates, PLC

(57) ABSTRACT

A curved display device and method for manufacturing the same is provided. The method for manufacturing a curved display device may include providing a display panel, a plurality of signal transfer elements, and a plurality of printed circuit boards, connecting one end of each of the signal transfer elements to the display panel and connecting the other end of each of the signal transfer elements to one of the printed circuit boards, on which one or more division guide portions are formed, dividing each of the printed circuit board into a plurality of sub printed circuit boards through cutting of the division guide portions; and bending the display panel connected to the sub printed circuit boards so that the display panel has a curvature.

5 Claims, 8 Drawing Sheets

CURVED DISPLAY DEVICE AND METHOD FOR MANUFACTURING THE SAME

CROSS-REFERENCE TO RELATED APPLICATION

This application claims priority from and the benefit of Korean Patent Application No. 10-2014-0174887, filed on Dec. 8, 2014, which is hereby incorporated by reference for all purposes as if fully set forth herein.

BACKGROUND

Field

Exemplary embodiments relate to a curved display device and a method for manufacturing the same.

Discussion of the Background

Recently, as flat panel display devices are used as television receivers, the sizes of the flat panel display devices are getting larger. With the growing trend of such large-sized flat panel display devices, there has been a problem that the difference in picture quality becomes greater depending on the angle at which a screen is viewed.

In order to solve this problem, a curved display device having a curvature, which is obtained by concavely or convexly bending a flat panel display device on which an image is displayed, has been proposed. The curved display device may have a curvature through forming a substrate of a display panel on which an image is displayed using a flexible substrate.

However, a printed circuit board, which applies data and control signals to the display panel of the curved display device for image display, is made of a rigid material rather than a flexible material. In general, the printed circuit board is electrically connected to the display panel through a flexible printed circuit or a chip on film that includes a driving IC for driving the display panel.

The above information disclosed in this Background section is only for enhancement of understanding of the background of the inventive concept, and, therefore, it may contain information that does not form the prior art that is already known in this country to a person of ordinary skill in the art.

SUMMARY

A curved display device is manufactured by connecting a printed circuit board (hereinafter referred to as "PCB") to a display panel through a flexible printed circuit (hereinafter referred to as "FPC") or a chip-on film (hereinafter referred to as "COF") and bending a display panel connected to the PCB so that the display device has a curvature.

However, if a force is applied to the PCB so that the PCB has a curvature after the PCB is attached to the display panel, stress is generated due to the material of the PCB, and thus the PCB comes off from the FPC or a COF in which the driving IC is mounted, or crack is generated on signal lines arranged on a contact surface between the FPC and the PCB.

Accordingly, exemplary embodiments provide a curved display device and a method for manufacturing the curved display device, which can improve reliability of the display device without greatly increasing the manufacturing cost of the product through improvement of the structure of a PCB.

Additional aspects will be set forth in the detailed description which follows, and, in part, will be apparent from the disclosure, or may be learned by practice of the inventive concept.

According to exemplary embodiments, a method for manufacturing a curved display device may include providing a display panel, a plurality of signal transfer elements, and a plurality of printed circuit boards, connecting one end of each of the signal transfer elements to the display panel and connecting the other end of each of the signal transfer elements to one of the printed circuit boards, on which one or more division guide portions are formed, dividing each of the printed circuit board into a plurality of sub printed circuit boards through cutting of the division guide portions, and bending the display panel connected to the sub printed circuit boards so that the display panel has a curvature.

According to exemplary embodiments, a curved display device may include a display panel displaying an image, a plurality of signal transfer elements each of which has one end connected to the display panel, and a plurality of printed circuit boards each of which is connected to the other end of each of the plurality of signal transfer elements to receive an input of an image signal from an outside and to apply data and control signals to each of the plurality of signal transfer elements, wherein each of the printed circuit boards includes a plurality of sub printed circuit boards.

One side surface of each of the plurality of sub printed circuit boards comprises a cutting surface, and a concavo-convex portion is formed on the cutting surface.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
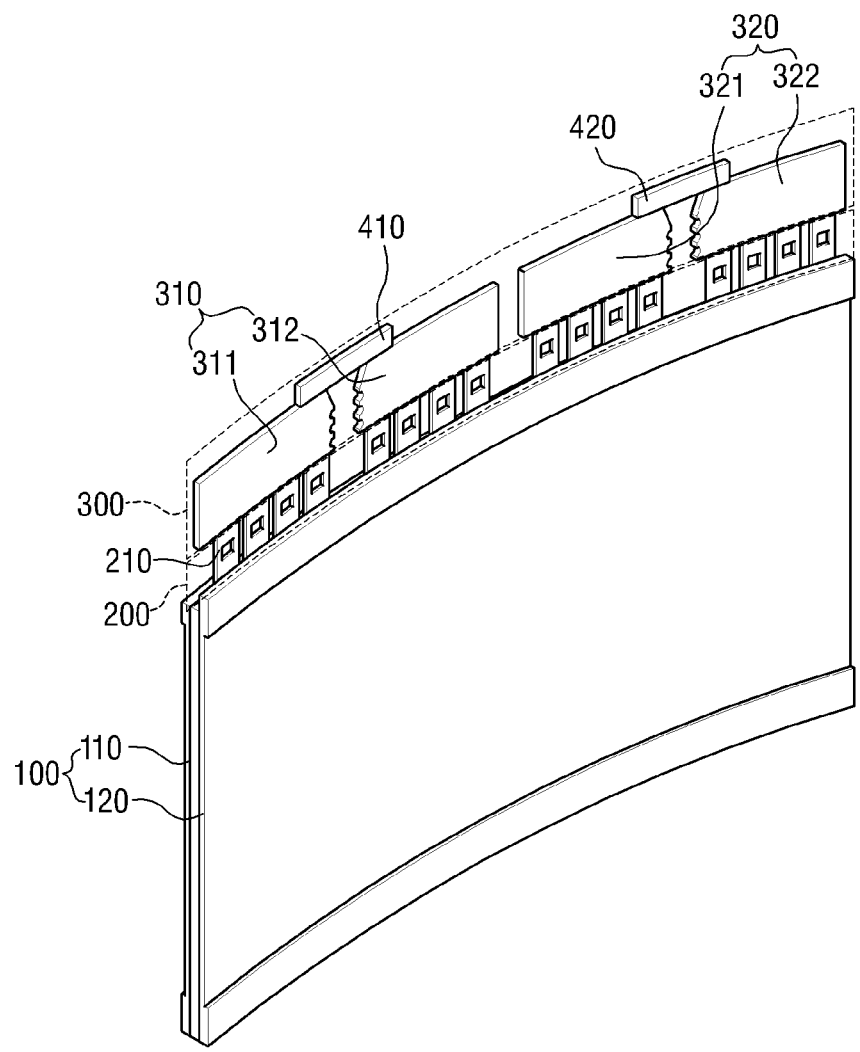
FIG. 1 is a perspective view schematically illustrating a curved display device according to an embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present invention will be described with reference to the accompanying drawings.

Figure 2:
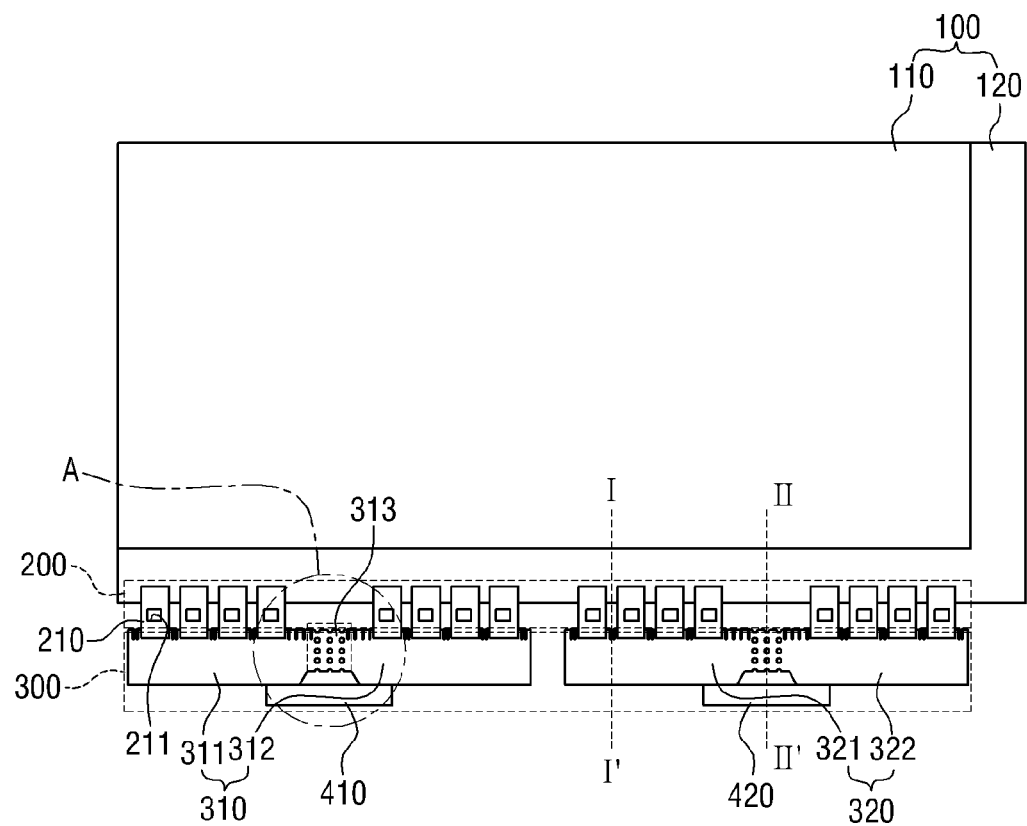
FIG. 2 is a plan view schematically illustrating a display device according to an embodiment of the present invention.

FIG. 1 is a perspective view schematically illustrating a curved display device according to an embodiment of the present invention, and FIG. 2 is a plan view schematically illustrating a curved display device according to an embodiment of the present invention.

Referring to FIGS. 1 and 2, a curved display device according to an embodiment of the present invention may include a panel region 100, a signal transfer region 200, and a control region 300.

The panel region 100 has a curved surface, and may include a first substrate 110 and a second substrate 120. The first substrate 110 and the second substrate 120 may be made of a flexible material so that the display region 100 can have a curved surface. A pixel region in which a plurality of pixels are arranged may be formed on at least one of the first substrate 110 and the second substrate 120, and such a pixel region may be a display region. On the other hand, as illustrated in FIG. 2, the first substrate 110 and the second substrate 120 may be formed to have different sizes, and the second substrate 120 that has a larger size than the size of the first substrate 110 may include a non-display region.

On the first substrate 110, a plurality of scan lines (not illustrated) and a plurality of data lines (not illustrated), which transfer data and control signals that are applied from the control region 300 to corresponding pixels, are arranged in the form of a matrix, and the plurality of pixels may be arranged in a region that is defined by the plurality of scan lines and the plurality of data lines. Here, each of the pixels may include switching elements, i.e., thin film transistors, which are turned on/off according to the control signals applied from the control region 300, and light emitting element that emit light according to on/off operations of the switching elements.

Referring to FIG. 2, the non-display region of the second substrate 120 may include a pad region (not illustrated) in which a plurality of pads for receiving pixel driving control signals applied from a driving IC 211 are arranged. The pad region may be electrically connected to the signal transfer region 200.

The signal transfer region 200 may be arranged between the panel region 100 and the control region 300, and may include a plurality of chip on films COFs. One end of the COF 210 may be electrically connected to the pad region of the panel region 100, and the other end may be electrically connected to signal lines 314 (in FIG. 3) of the control region 300 or a connector (not illustrated). For example, the COF 210 may include a plurality of output wires that are electrically connected to the pad region of the panel region 100 on a flexible insulating film made of a material such as polyimide (PI), a plurality of input wires that are electrically connected to the control region 300, and the driving IC 211 that is mounted on a predetermined region of the flexible insulating film. The driving IC 211 receives the data and the control signals that are applied from the control substrate 300, and generates and transfers the pixel driving control signals to the plurality of scan lines or the plurality of data lines that are arranged in the display region, so that the pixels of the panel region 100 are driven to display an image. In an embodiment of the present invention, it is exemplified that the driving IC 211 is mounted in a COF method, but is not limited thereto. The driving IC 211 may be mounted in a chip on glass (COG) method. In the case where the driving IC 211 is mounted in the COG method, the panel region 100 and the control region 300 may be electrically connected to each other through the flexible printed circuit (FPC).

The control region 300 may receive an image signal from an outside, and generate and apply the data and the control signals to the panel region 100. The control region 300 may include a plurality of sub printed circuit boards (hereinafter referred to as "SPCBs") 311, 312, 321, and 322, a first FPC 410, and a second FPC 420. The plurality of SPCBs 311, 312, 321, and 322 may be arranged to form pairs. For example, the first SPCB 311 and the second SPCB 312 may form a pair, and the third SPCB 321 and the fourth SPCB 322 may form a pair. That is, a first PCB 310 may include the first SPCB 311 and the second SPCB 312, and a second PCB 320 may include the third SPCB 321 and the fourth SPCB 322. As described later with reference to FIG. 3, this is because the first SPCB 311 and the second SPCB 312 are formed by cutting the first PCB 310 through a division guide portion 313, and the third SPCB 321 and the fourth SPCB 322 are formed by cutting the second PCB 320 through the division guide portion 313. Accordingly, the plurality of SPCBs 311, 312, 321, and 322 may include a cutting surface that is provided by forming a concavo-convex portion on any one side, and the cutting surface may be arranged so that the SPCBs that form the pairs face each other as illustrated in FIG. 1. The first FPC 410 may electrically connect the first SPCB 311 and the second SPCB 312, which form the pair, to each other, and the second FPC 420 may electrically connect the third SPCB 321 and the fourth SPCB 322 to each other. Currently disclosed exemplary embodiment shows only 2 pairs of SPCBs, but it is not limited. Depending on the size and curvature of the display, and for any other requirements, actual displays may have various numbers of SPCBs. The control region 300 as described above will be described in more detail with reference to FIGS. 3, 4 and 5.

Figure 3:
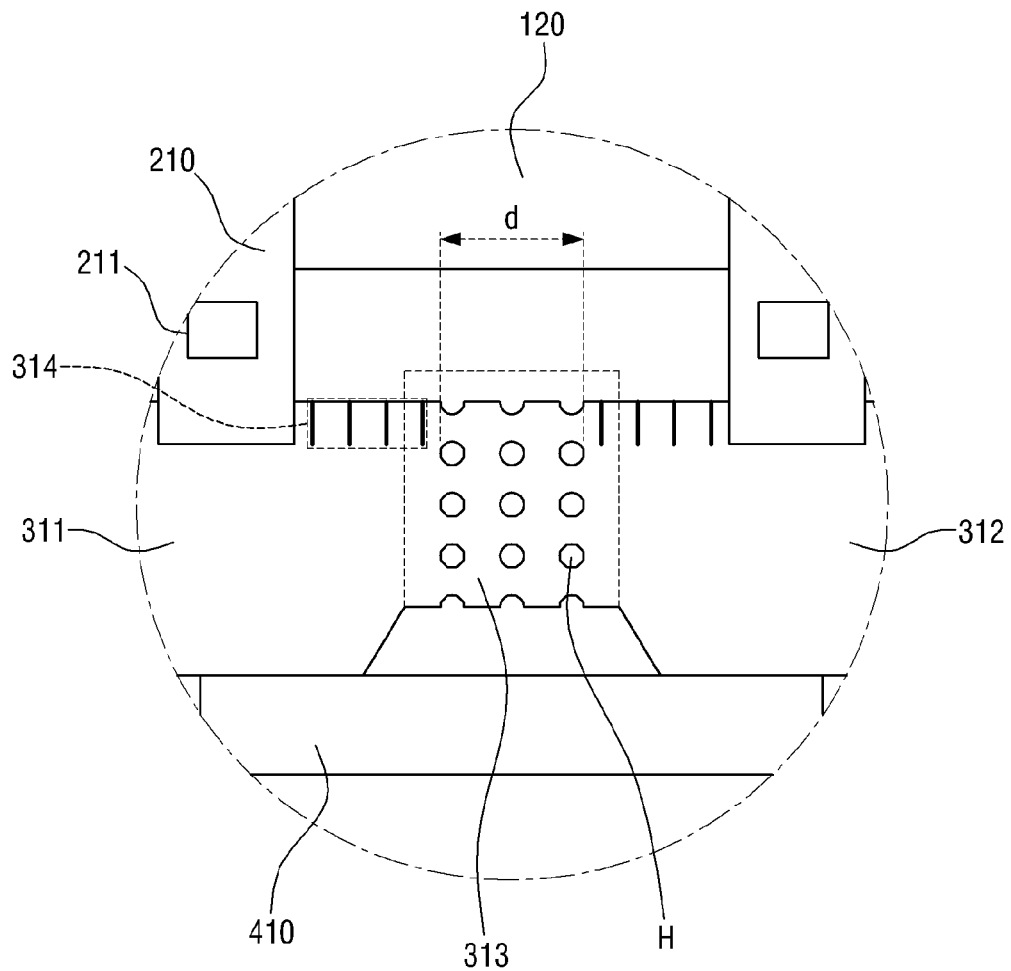
FIG. 3 is an enlarged view of portion A of FIG. 2.
Figure 4:
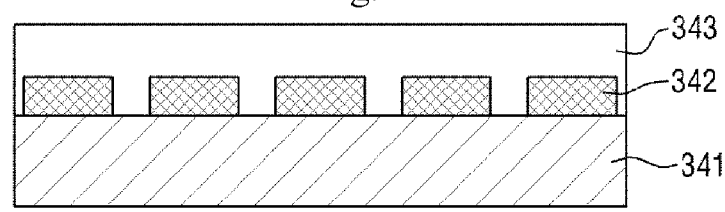
FIG. 4 is a cross-sectional view taken along line I-I' of FIG. 2.
Figure 5:
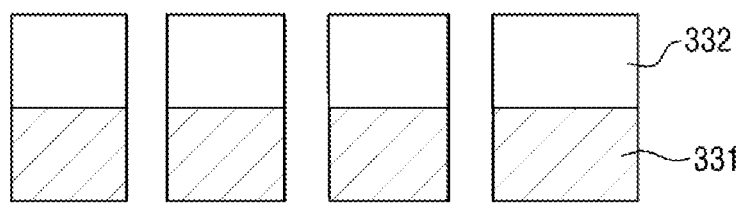
FIG. 5 is a cross-sectional view taken along line II-II' of FIG. 2.

FIG. 3 is an enlarged view of portion A of FIG. 2. FIG. 4 is a cross-sectional view taken along line I-I' of FIG. 2, and FIG. 5 is a cross-sectional view taken along line II-II' of FIG. 2.

In describing the structure of a printed circuit board (PCB) of FIG. 3 according to an embodiment of the present invention, the first PCB 310 will be described as a representative example, but the second PCB 320 may have the same structure.

Referring to FIG. 3, the first PCB 310 according to an embodiment of the present invention may include the division guide portion 313 capable of dividing the first PCB 310 into the first SPCB 311 and the second SPCB 312 before the display device is bent to be applicable to the curved display device, the signal lines 314 arranged to be electrically connected to the COFs 210, and the first FPC 410.

The first FPC 410 may be arranged to electrically connect the first SPCB 311 and the second SPCB 312 to each other in the case where the first PCB 310 is divided into the first SPCB 311 and the second SPCB 312. Accordingly, the first FPC 410 may be arranged to correspond to the region in which the division guide portion 313 is arranged.

The division guide portion 313 may include a plurality of holes H that are arranged in three lines in a vertical direction, and the division guide portion 313 may be formed with a size that is smaller than the size of the SPCBs 311, 312, 321, and 322. The division guide portion 313 may be cut using pruning shears or a nipper later, and the first PCB 310 may be divided into the first SPCB 311 and the SPCB 312. In an embodiment, it is illustrated that the plurality of holes H of the division guide portion 313 are arranged in three lines in the vertical direction, but are not limited thereto. The plurality of holes may be arranged in more than three lines or in less than three lines. If the division guide portion 313 is cut around the holes formed as described above, as illustrated in FIG. 1, the cutting surface may be arranged on the surface on which the first SPCB 311 and the second SPCB 312 face each other, and the concavo-convex portion may be formed on the cutting surface. In this case, it is preferable that the width d of the division guide portion 313 in the horizontal direction is equal to or smaller than 10 mm. This is because the PCB that is applied to the curved display device is limited in length. The division guide portion 313 may be arranged in the center region of the first PCB 310. However, the position of the division guide portion 313 is not limited to the center region, but one or more division guide portions 313 may be formed in another region that is not the center region according to a designer's design or the number of SPCBs that are divided from the PCB. Further, a groove in the form of a trapezoid may be formed at a lower end of the printed circuit board 310 that corresponds to the region in which the division guide portion 313 is formed. The signal lines for transferring the data and the control signals may not be arranged in the division guide portion 313. Referring to FIG. 5, the division guide portion 313 may be formed to include a cover film 332 of an insulating material on an upper portion of the substrate 331. In contrast, according to the first SPCB 311, referring to FIG. 4, a metal pattern 342, i.e., the signal lines 314 (in FIG. 3), may be arranged on the upper portion of the substrate 341, and a cover film 343 of an insulating material may be formed on an upper portion of the metal pattern 342. In other words, the substrate 331 of division guide portion 313 is formed of the same material as the material of the substrate 341 of each of the other SPCBs, but the signal lines 314 (in FIG. 3) are not arranged thereon. The division guide portion 313 may have a different shape without being composed of the plurality of holes H only.

According to the curved display device according to an embodiment of the present invention, the PCB that includes the division guide portion 313 is arranged and divided using only a cutting tool (e.g., pruning shears or nipper), and thus the PCB of a rigid material can be applied to the curved display device more easily.

Further, in comparison to a general display device that includes attached PCBs of which the number differs depending on the size of the display device (e.g., a display device having a size of 55 inches or less may include two PCBs attached to each other, and a display device having a size of 60 inches or more may include four PCBs attached to each other), the curved display device according to an embodiment of the present invention includes one or two PCBs attached to each other regardless of the size of the display device. Further, according to the curved display device according to an embodiment of the present invention, since a plurality of division guide portions 313 are formed to facilitate division of the PCB before it is formed to have a curved surface, the cost for separately attaching the PCBs can be reduced, and thus the manufacturing cost can be prevented from being increased.

Figure 6:
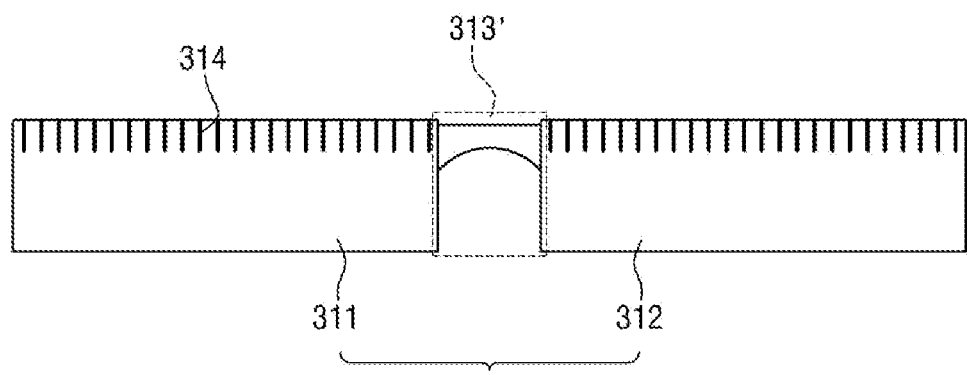
FIG. 6 is a plan view schematically illustrating a printed circuit board (PCB) according to another embodiment of the present invention.
Figure 7:
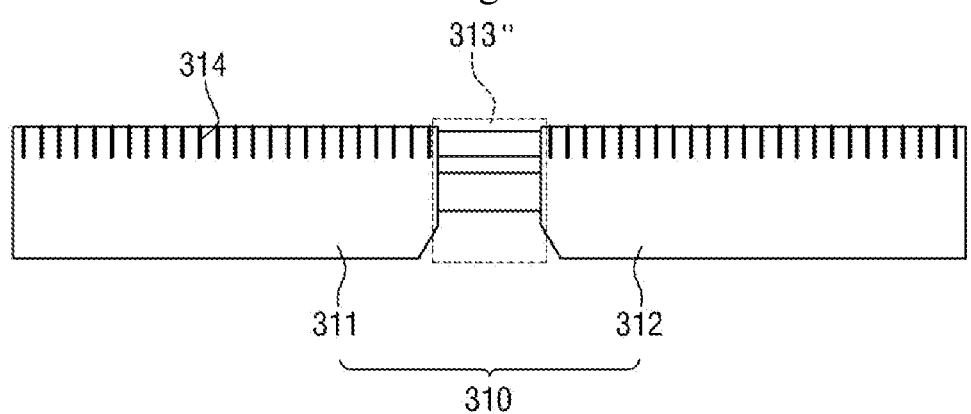
FIG. 7 is a plan view schematically illustrating a printed circuit board (PCB) according to still another embodiment of the present invention.

FIG. 6 is a plan view schematically illustrating a printed circuit board (PCB) according to another embodiment of the present invention, and FIG. 7 is a plan view schematically illustrating a printed circuit board (PCB) according to still another embodiment of the present invention.

In describing the structure of a printed circuit board (PCB) of FIGS. 6 and 7 according to other embodiments of the present invention, the first PCB 310 will be described as a representative example, but the second PCB 320 may have the same structure.

Referring to FIG. 6, the division guide portion 313' of the first PCB 310 that is divided into the first SPCB 311 and the second SPCB 312 may have a rectangular shape and the lower end of the division guide portion 313' may be formed to have a curvature. The division guide portion 313 formed as described above may be cut using a nipper. The division guide portion 313' may be formed with a size that is smaller than the size of the SPCBs 311, 312. In this case, it is illustrated that the division guide portion 313' has a rectangular shape and the lower end thereof includes a curvature, but is not limited thereto. The division guide portion 313 may be formed in the form of a rectangular shape only.

On the other hand, referring to FIG. 7, the division guide portion 313" of the first PCB 310 that is divided into the first SPCB 311 and the second SPCB 312 may have a rectangular groove that is formed in the center region of the division guide portion 313" to be divided into two portions. The division guide portion 313" formed as described above may be cut using a nipper. The division guide portion 313" may be formed with a size that is smaller than the size of the SPCBs 311, 312.

In the case where the division guide portion 313' and 313" has a shape as illustrated in FIGS. 6 and 7, the concavo-convex portion may not be formed on the cutting surface of the SPCBs 311, 312, 321, and 322.

FIGS. 8 through 11 are plan views schematically illustrating a method for manufacturing a curved display panel according to an embodiment of the present invention.

First, the display panel 100, a plurality of signal transfer elements (e.g. COFs) 210, and a plurality of printed circuit boards 310, 320 are provided.

Figure 8:
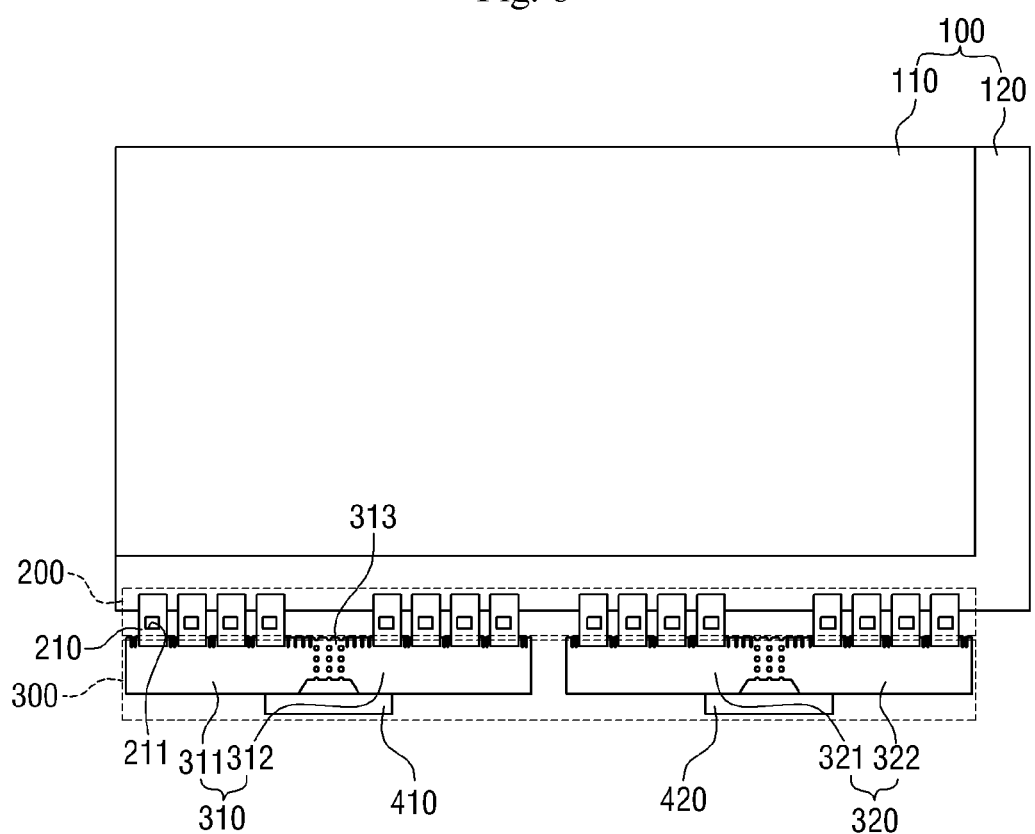
FIGS. 8 to 11 are plan views schematically illustrating a method for manufacturing a curved display device according to an embodiment of the present invention.

And then as illustrated in FIG. 8, according to a display device according to an embodiment of the present invention, a plurality of scan lines and data lines are formed, and a plurality of pixels, which are defined by the plurality of scan lines and data lines, are formed to complete a display region 100, and then a plurality of COFs 210 including driving ICs 211 are electrically connected to pads of the display region 100. Thereafter, the plurality of COFs 210 are electrically connected to a first PCB 310 and a second PCB 320 including division guide portions 313. In this case, each of the first and second PCBs 310 and 320 may include a first FPC 410 that is arranged at an end in a vertical direction of a region in which a first SPCB 311 and a second SPCB 312 are divided from each other, i.e., a region in which the division guide portion 313 is formed, and a second FPC 420 that is arranged at an end in a vertical direction of a region in which a third SPCB 321 and a fourth SPCB 322 are divided from each other.

Figure 9:
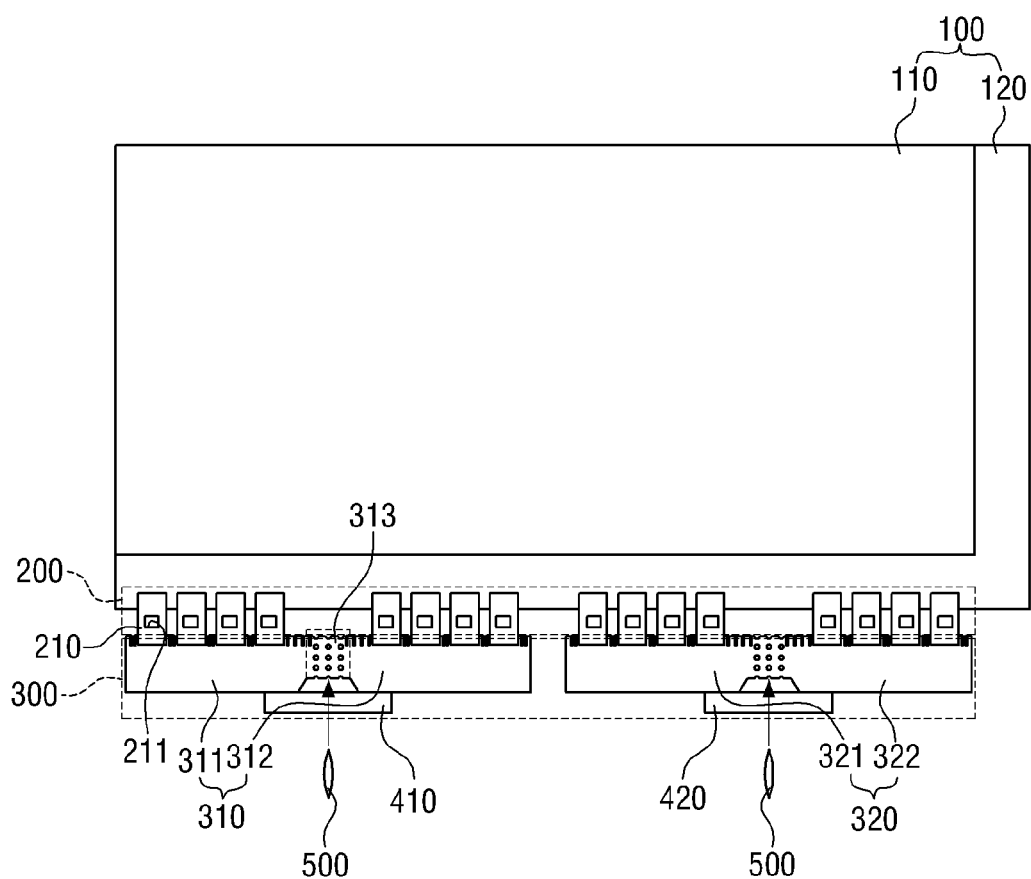

Thereafter, as illustrated in FIG. 9, the first SPCB 311, the second SPCB 312, the third SPCB 321, and the fourth SPCB 322 are formed through cutting of the division guide portion 313 using a cutting tool 500, such as pruning shears or a nipper.

Figure 10:
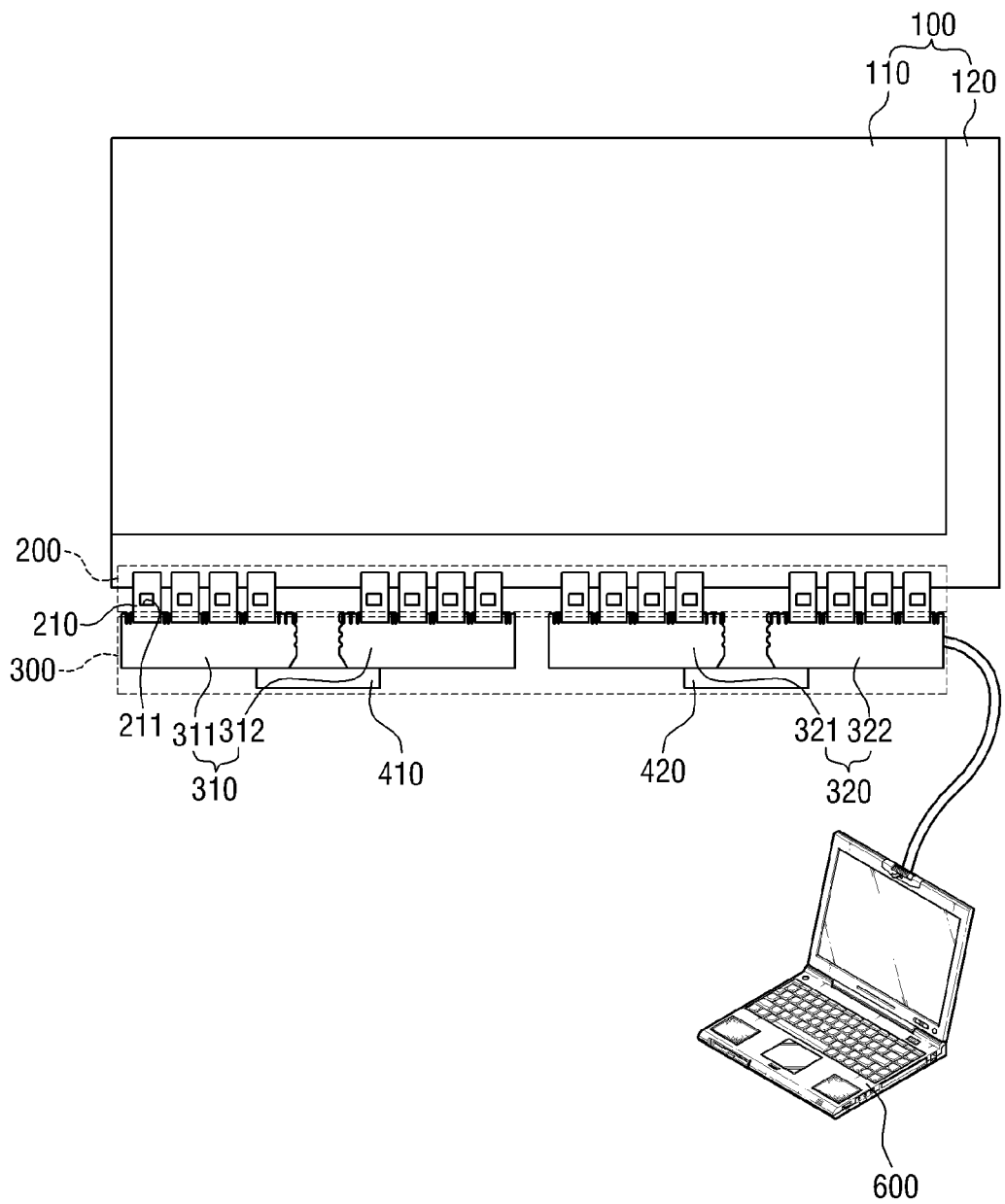

Thereafter, as illustrated in FIG. 10, a display device is tested using a test device 600 for testing the display device.

Figure 11:
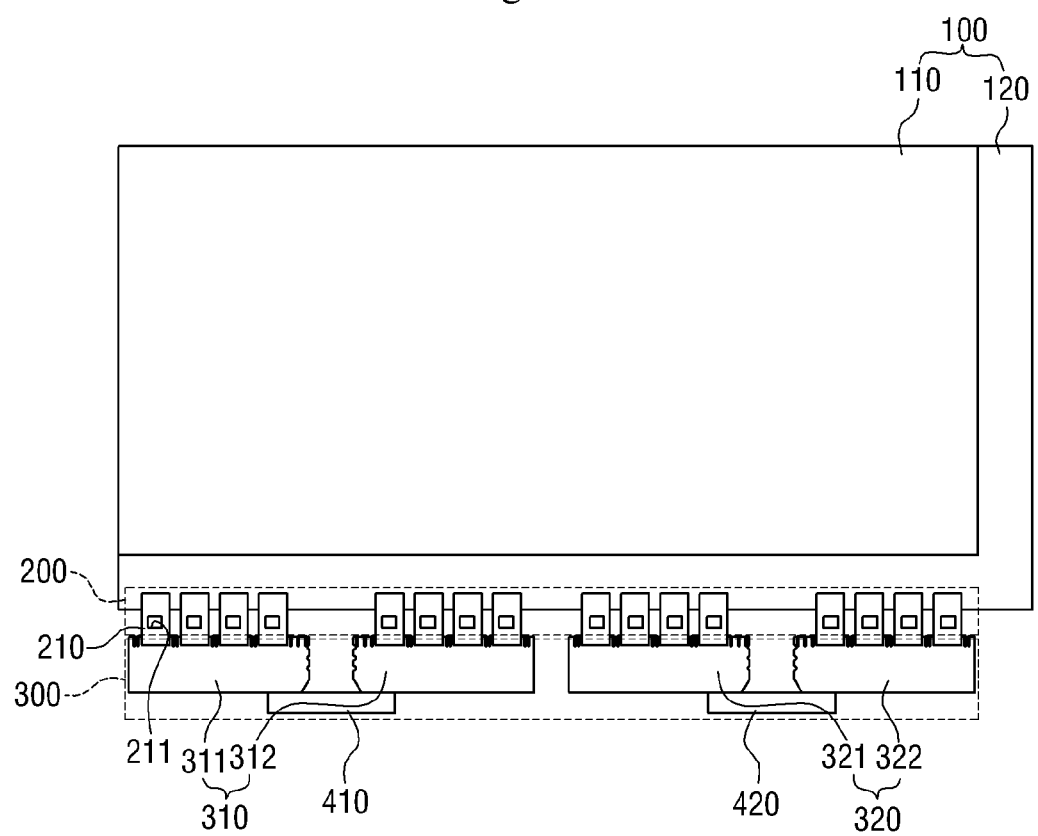

If no error occurs as the result of the test, the display device is bent to have a curvature by applying a force thereto to complete a curved display device as illustrated in FIG. 11.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A curved display device, comprising:
   a display panel displaying an image;
   a plurality of signal transfer elements each of which has one end connected to the display panel; and
   a plurality of printed circuit boards each of which is connected to the other end of each of the plurality of signal transfer elements to receive an input of an image signal from outside and to apply data and control signals to each of the plurality of signal transfer elements,
   wherein each of the printed circuit boards includes a plurality of sub printed circuit boards that are arranged to form a plurality of pairs, and a plurality of flexible printed circuits electrically connecting the plurality of sub printed circuit boards that form the pairs.

2. The curved display device of claim 1, wherein one side surface of each of the plurality of sub printed circuit boards comprises a cutting surface, and
   a concavo-convex portion is formed on the cutting surface.

3. The curved display device of claim 1, wherein the plurality of sub printed circuit boards that form the pairs are arranged so that the cutting surfaces face each other.

4. The curved display device of claim 1, wherein each of the plurality of signal transfer elements is a chip on film (COF) including a driving IC for controlling driving of the display panel.

5. The curved display device of claim 1, wherein the display panel is made of a flexible material, and the plurality of printed circuit boards are made of a rigid material.

* * * * *